United States Patent [19]

Etoh et al.

[11] 4,405,705

[45] Sep. 20, 1983

[54] PHOTOSENSITIVE RESIN COMPOSITION CONTAINING BASIC POLYMERIC COMPOUNDS AND ORGANIC CARBOXYLIC ACIDS

[75] Inventors: Kuniomi Etoh; Masaru Nampei; Shinichi Tanaka, all of Otsu, Japan

[73] Assignee: Toyo Boseki Kabushiki Kaisha t/a Toyoba Co., Ltd., Japan

[21] Appl. No.: 286,825

[22] Filed: Jul. 27, 1981

[51] Int. Cl.$^3$ .................................................. G03C 1/68
[52] U.S. Cl. .................................... 430/270; 430/281; 430/302
[58] Field of Search ........................ 430/270, 302, 281

[56] References Cited

U.S. PATENT DOCUMENTS

| | | | |
|---|---|---|---|
| 4,049,457 | 9/1977 | Rice | 430/270 |
| 4,063,953 | 12/1977 | Fukutani | 430/287 |
| 4,145,222 | 3/1979 | Etoh | 430/281 |
| 4,269,930 | 5/1981 | Kress | 430/270 |

FOREIGN PATENT DOCUMENTS 55-98744  7/1980  Japan .

*Primary Examiner*—John D. Smith
*Attorney, Agent, or Firm*—Jones, Tullar & Cooper

[57] ABSTRACT

A photosensitive resin composition which comprises
(1) at least one of the group comprising basic polymeric compounds which have a molecular weight of not less than 1,000, contain basic nitrogen atoms and are themselves poor in hydrophilic properties but, in the presence of an acidic substance, show good hydrophilic properties due to the acid-base interaction, and
(2) at least one of the group comprising organic carboxylic acids which are themselves acidic but, when irradiated with light, lose their acidic property due to a chemical conversion.

11 Claims, No Drawings

PHOTOSENSITIVE RESIN COMPOSITION CONTAINING BASIC POLYMERIC COMPOUNDS AND ORGANIC CARBOXYLIC ACIDS

The present invention relates to a photosensitive resin composition. More particularly, it relates to a photosensitive resin composition utilizing a change in hydrophilic properties of a polymeric compound by a photochemical reaction.

In recent years, there have been proposed various photosensitive resin compositions, and with development of such compositions, the improvement of their performances such as resolving power, sensitivity, shelf life and processability is always demanded.

As a result of extensive study, we have now succeeded in providing a photosensitive resin composition having good performance on the basis of an entirely new mechanism.

The photosensitive resin composition of the present invention comprises (1) at least one of a group comprising basic high molecular compounds which have a molecular weight of not less than 1,000, contain basic nitrogen atoms and have poor hydrophilic properties but, in the presence of an acidic substance, shows high hydrophilic properties due to an acid-base interaction, and (2) at least one of a group comprising organic carboxylic acids which are themselves acidic but, when irradiated with light, lose their acidic property due to a chemical conversion.

The photosensitive resin composition of the invention is hydrophilic prior to the irradiation with light and, as a result of such irradiation, has reduced hydrophilic properties. The term "hydrophilic" herein used may be understood to indicate "hydrophilic" or "water-soluble", inclusively.

The composition of the invention can be molded in an appropriate shape by conventional molding procedures. Advantageously, it is possible to make a latent image on pattern at the surface of the shaped article prepared by the use of the composition, the latent image or pattern corresponding to the portion irradiated or not irradiated with light and having different hydrophilic properties from the other part. It is also possible to change such latent image to a visible image by treatment with water.

The most characteristic feature of the invention is the combined use of the basic polymeric compound and the organic carboxylic acid. Depending upon their composition, it is possible to regulate appropriately the extent of the difference in hydrophilic properties between the irradiated portion and the non-irradiated portion of the article. Quite different from conventional photosensitive compositions utilizing any crosslinking reaction, no dimensional shrinkage is produced in the composition of the invention after irradiation. Thus, the formed image has no strain, and a high resolving power can be maintained. Further, since the basic polymeric compound is substantially soluble in solvents even after exposure to light, the modification of the once formed, is quite possible. Furthermore, inhibitory action of oxygen or air is not exerted on the composition of the invention, and it is quite possible to form the latent or visible image in the air. In addition, the composition of the invention is quite stable to heat, and its long shelf life can be assured. Besides, it is a notable advantage that on development by converting a latent image into a visible image, water can be used as a developing agent.

The basic polymeric compound employed as one of the essential components in the composition of the invention is required to have a molecular weight of not less than 1,000, to have one or more basic group(s) on the monomer(s) constituting units of the polymeric chain and to show a pKa value of not less than 2 and not more than 15 contributed by the basic group when measured in an aqueous medium by the potentiometric titration. Such polymeric compound may be chosen from polymeric compounds prepared by conventional polymerization procedures (e.g. polycondensation, polyaddition) of a monomeric compound(s) having a basic group in the molecule with or without any other monomeric compound(s), modified polymeric compounds prepared by subjecting synthetic or natural polymeric compounds to chemical reaction so as to impart a basic property thereto, etc. It may be also chosen from homopolymers, random copolymers, block copolymers, etc. Typical examples of basic polymeric compounds are polymeric compounds having basic nitrogen atoms therein. In this case, the content of basic nitrogen atoms may be usually from 0.1 to 25 equivalent/kg, preferably from 0.1 to 14 equivalent/kg. More specifically, basic polymeric compounds may be basic polyamides, basic polyesters, basic vinylic polymers, basic polyethers, basic cellulose derivatives. etc.

Basic polyamides can be prepared using the following monomers: diamines (e.g. N-(2-aminoethyl)piperazine, N-(4-aminocyclohexyl)piperazine, N-(2-aminoethyl)-3-methylpiperazine, N,N'-bis(aminomethyl)piperazine, N-(aminomethyl)-N'-(2-aminoethyl)piperazine, N,N'-bis(2-aminoethyl)methylamine, N,N-bis(3-aminopropyl)cyclohexylamine, N,N'-dimethyl-N,N'-bis(3-aminopropyl)ethylenediamine, N,N'-dicyclohexyl-N,N'-bis(3-aminopropyl)hexamethylenediamine, 6-methyl-6-(N,N-dimethylaminomethyl)-4,8-dioxa-1,11-undecanediamine, 6-ethyl-6-(N,N-dimethylaminomethyl)-4,8-dioxa-1,11-undecanediamine, 6,6-bis(N,N-dimethylaminomethyl)-4,8-dioxa-1,11-undecanediamine), ω-amino acids (e.g. N-carboxymethylpiperazine, N-(4-carboxycyclohexyl)piperazine, N-(2-carboxyethyl)-3-methylpiperazine, N-(aminomethyl)-N'-(carboxymethyl)piperazine, N-(aminomethyl)-N'-(carboxymethyl)-2-methylpiperazine, N-(aminomethyl)-N-(carboxymethyl)methylamine, N-(aminomethyl)-N-(2-carboxyethyl)isopropylamine, N,N'-dimethyl-N-(aminomethyl)-N'-(carboxymethyl)ethylenediamine, N,N'-dimethyl-N-(aminomethyl)-N'-(carboxyethyl)hexamethylenediamine) and their lower alkyl esters, dicarboxylic acids (e.g. N,N'-bis(carboxymethyl)piperazine, N,N'-bis(carboxymethyl)-2,6-dimethylpiperazine, N-(2-carboxymethyl)-N'-(carboxymethyl)piperazine, N,N-bis(-carboxymethyl)methylamine, N-carboxymethyl-N-(2-carboxyethyl)methylamine, N,N'-dimethyl-N,N'-bis(-carboxymethyl)ethylenediamine, N,N'-dimethyl-N,N'-bis(3-carboxypropyl)hexamethylenediamine) and their lower alkyl esters and acid halides, etc. Among these monomers, one or more may be chosen. In addition to these monomers, there may be used other monomers which are conventionally employed in the production of ordinary polyamides. Their examples are aliphatic and aromatic dicarboxylic acids, diamines, ω-amino acids, lactams, etc.

Basic polyesters can be produced using the following monomers: dicarboxylic acids (e.g. N,N'-bis(carboxymethyl)piperazine, N,N'-bis(carboxymethyl)-2,6-dimethylpiperazine, N-(2-carboxyethyl)-N'-(carboxymethyl)piperazine, N,N-bis(carboxymethyl)methylamine, N-carboxymethyl-N-(2-carboxyethyl)methylamine, N,N'-dimethyl-N,N'-bis(carboxymethyl)ethylenediamine, N,N'-dimethyl-N,N'-bis(3-carboxypropyl)hexamethylenediamine) and their lower alkyl esters and acid halides, glycols (e.g. N,N'-bis(hydroxymethyl)piperazine, N,N'-bis(2-hydroxypropyl)-2,5-dimethylpiperazine, N,N'-bis(2-hydroxycycloheptyl)piperazine, N,N'-bis(2-methyl-2-hydroxynonyl)piperazine, N,N'-bis(2-hydroxyethyl)amine, N,N-bis(2-hydroxypropyl)isopropylamine, N,N'-dimethyl-N,N'-bis(2-hydroxyethyl)ethylenediamine, N,N'-dicyclohexyl-N,N'-bis(2-hydroxyethyl)hexamethylenediamine, N,N'-dimethyl-N,N'-bis(2-hydroxyethyl)-2,2,4-trimethylhexamethylenediamine, 2-methyl-2-(N,N-dimethylaminomethyl)-1,3-propanediol, 2-methyl-2-(N,N-diisopropylaminomethyl)-1,3-propanediol, 2-methyl-2-piperidinomethyl-1,3-propanediol, bis(2-N,N-diisopropylaminomethyl)-1,3-propanediol), etc. Among them, one or more may be selected. In addition to these, there may be used conventional monomers employed for ordinary polyesters such as aliphatic and aromatic dicarboxylic acids and their lower alkyl esters, glycols, oxyacids, etc.

Basic vinylic polymers may be produced using the following monomers: vinylpyridines (e.g. 4-vinylpyridine), methacrylates (e.g. 2-(N,N-dimethylamino)ethyl methacrylate, 3-(N,N-diethylamino)propyl methacrylate), methacrylamides (e.g. 3-(N,N-dimethylamino)propylmethacrylamide, 3-(N,N-diethylamino)propylmethacrylamide), etc. From these monomers, one or more may be chosen. In addition to these, other monomers conventionally employed for the production of ordinary vinylic polymers may be used.

Basic polyethers can be produced, for instance, by polycondensation of basic diols or their functional derivatives with or without other diols or their functional derivatives in conventional procedures. Examples of said other diols and their functional derivatives are ethylene glycol, propylene glycol, tetramethylene glycol, hexamethylene glycol, diethylene glycol, polyethylene glycol (molecular weight, 200 to 3,000, preferably 200 to 1,000), polytetramethylene glycol, bis(4-hydroxyphenyl)methane, 1,1-bis(4-hydroxyphenyl)cyclohexane, bis(4-hydroxyphenyl)thioether, bis(4-hydroxyphenyl)sulfone, 2,2'-dihydroxybenzophenone, 2,2'-dihydroxy-4,4'-dimethoxybenzophenone, cresol, resorcinol, hydroquinone, 2,4-dihydroxyacetophenone, 1,5-dihydroxynaphthalene, p-, m- or o-xylylene glycol, etc.

Examples of modified polymeric compounds which can be employed are cellulose derivatives modified with ethylene amine such as aminoethycellulose, and polymers provided with basic properties by grafting, etc.

In addition to the said basic polymeric compound(s), the composition of this invention may comprise optionally any other high molecular compound(s).

The organic carboxylic acid which is the other essential component is required to lose its acidic property as the result of the chemical conversion which is caused by light irradiation. Examples of such acids include 2-nitrophenylacetic acid, 4-nitrophenylacetic acid, 4-nitrohomophthalic acid, 2,4-dinitrophenylacetic acid, 4,4'-dinitrodiphenylacetic acid, 2-cyanophenylacetic acid, 4-cyanophenylacetic acid, 2,4-dicyanophenylacetic acid, 4,4'-dicyanodiphenylacetic acid, 2-chlorophenylacetic acid, 4-chlorophenylacetic acid, 2,4-dichlorophpenylacetic acid, 4,4'-dichlorodiphenylacetic acid, 2-carboxyphenylacetic acid, 4-carboxyphenylacetic acid, etc. The compounds represented by the following formulas are also examples of useful acids:

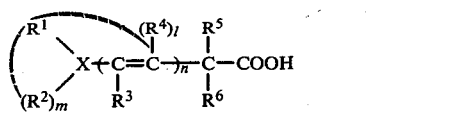

wherein X is nitrogen, oxygen, sulfur or selenium, $R^1$ and $R^2$ are each hydrogen, substituted or unsubstituted aryl, substituted or unsubstituted $C_1$–$C_6$ alkyl or phenylene, $R^3$ and $R^4$ are each hydrogen or $C_1$–$C_3$ alkyl, $R^5$ and $R^6$ are each hydrogen or substituted or unsubstituted $C_1$–$C_6$ alkyl and l, m and n are each an integer of 0 or 1;

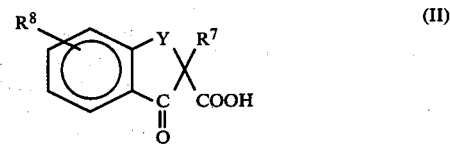

wherein Y is —$NR^9$— or sulfur, $R^7$ and $R^9$ are each hydrogen or $C_1$–$C_3$ alkyl and $R^8$ is hydrogen, nitro, cyano, lower alkoxy or halogen; and

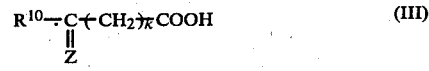

wherein Z is oxygen or sulfur, $R^{10}$ is substituted or unsubstituted phenyl and k is an integer of 0 or 1.

In the above formula (I), examples of the substituent which may be present on the aryl or alkyl group represented by $R^1$ or $R^2$ are halogen, hydroxyl, lower alkyl, nitro, cyano, lower alkylcarbonyl, lower alkoxy, N-substituted carbamoyl, N-substituted sulfamoyl, etc. Examples of the substituent which may be present on the alkyl group represented by $R^5$ or $R^6$ are hydroxyl, imidazolyl, aminocarbonyl, etc. Thus, specific examples of the compound of the formula (I) are as follows: N-phenylglycine, N-(3-chlorophenyl)gylcine, N-(2,4-dichlorphenyl)glycine, N-(4-acetylphenyl)glycine, N-(2,4-dichlorophenyl)glycine, N-(4-acetylphenyl)glycine, N-(2-nitrophenyl)glycine, N-(4-nitrophenyl)glycine, N-(2,4-dinitrophenyl)glycine, N-(4-cyanophenyl)glycine, N-(3-chlorophenyl)glycine, N-(2-bromophenyl)glycine, N-(2-methylphenyl)glycine, N-(2-methoxyphenyl)glycine, N-(2-methoxyphenyl)glycine, N-(2,4-dimethoxyphenyl)glycine, N-methyl-N-phenylglycine, N-methyl-N-(2-methylphenyl)glycine, N-methyl-N-(4-chlorophenyl)glycine, N-methyl-N-(2-nitrophenyl)glycine, N-methyl-N-(2-methoxyphenyl)glycine, N-(4-carbamoylphenyl)glycine, N-(4-sulfamoylphenyl)glycine, N-phenylalanine, N-phenylserine, N-phenylhistidine, N-phenylasparagine, N-phenylglutamine, N-carboxymethylcarbazol, 3-anilino-2-propene-1-carboxylic acid indole-3-acetic acid, phenoxyacetic acid, 2-methylphenoxyacetic acid, (3-methoxyphenoxy)acetic acid, (4-nitrophenoxy)acetic acid, (3-chlorophenoxy)acetic acid, (4-methylphenoxy)acetic acid, thiophenoxyacetic acid, 3-methoxythiophenoxyacetic acid, 2-chlorothiophenoxyacetic acid, 2-methylthiophenoxyacetic acid, 4-nitrothiophenoxyacetic acid, S- hydroxyethylthioacetic acid, S-hydroxyethylthiophenoxyacetic acid, S-n-butylthioacetic acid, phenylcarboxymethylselenide, etc.

Specific examples of the compounds of the formula (II) are indoxylic acid, 4-nitroindoxylic acid, thioindoxylic acid, N-methylindoxylic acid, etc.

The substituent which may be present on the phenyl group represented by $R^{10}$ may be, for instance, halogen, nitro, lower alkoxy, lower alkyl, amino or the like. Thus, specific examples of the compounds of the formula (III) are benzoylformic acid, 2-chlorobenzoylformic acid, 4-chlorobenzoylformic acid, N-dimethylaminobenzoylformic acid, thiobenzoylformic acid, benzoylacetic acid, thiobenzoylacetic acid, etc.

The basic polymeric compound and the organic carboxylic acid in the composition of the invention are varied in their composition and may be appropriately chosen depending upon the performances desired on their use such as the difference in hydrophibic properties before and after light irradiation, the mechanical characteristics and reaction rate. In general, the content of the organic carboxylic acid in the composition may be from 0.4 to 700 g/kg, and the equivalent proportion of the acidic group in the organic carboxylic acid and the basic nitrogen atom in the basic polymeric compound may be about 0.02–1:1.

The composition of the invention optionally may comprise any acidic compound which usually does not lose its acidic property even when irradiated with light in order to control the difference in hydrophilic properties before and after irradiation.

The composition of the invention may also comprise as an optional component any photo-insolubilizing agent to regulate the difference in the hydrophilic properties as well as mechanical properties. Examples of the photo-insolubilizing agents are monomers having one unsaturated double bond such as acrylic acid, methacrylic acid, methyl acrylate, methyl methacrylate, cyclohexyl acrylate, acrylamide, methacrylamide, N-methylolacrylamide, N-butoxymethylacrylamide, sodium acrylate, ammonium acrylate, acrylonitrile, styrene, sodium styrenesulfonate and vinylpyridine, monomers having two or more unsaturated double bonds such as glycidyl methacrylate, allyl methacrylate, ethylene glycol diacrylate, ethylene glycol dimethacrylate, 1,3-propanediol acrylate, 1,3propanediol methacrylate, trimethylolpropane triacrylate, trimethylolpropane, trimethacrylate, triacryloyloxyethyl phosphate, methylenebisacrylamide and methylenebismethacrylamide, etc.

When a triaryl imidazolyl dimer of the following formula is incorporated in the composition of the invention, the sensitivity of such composition to light is markedly increased, because the dimer liberates a radical on the irradiation with light and such radical causes or promotes the chemical conversion which lowers the acidic property of the organic carboxylic acid:

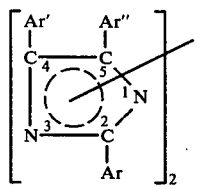

(IV)

wherein Ar, Ar' and Ar" are each substituted or unsubstituted aryl. When Ar represents a phenyl group, it is preferred to bear any substituent at the ortho-position. When Ar indicates an 1-naphthyl group, it is favorable to bear any substituent at the 2-position. Specific examples of the compound of the formula (IV) are as follows: 2-(o-chlorophenyl)-4,5-diphenylimidazolyl dimer, 2-(o-chlorophenyl)-4,5-(m-dichlorophenyl)imidazolyl dimer, 2-(o-chlorophenyl)-4,5-(m-dianisyl)imidazolyl dimer, 2-(o-fluorophenyl)-4,5-diphenylimidazolyl dimer, 2-(o-methoxyphenyl)-4,5-diphenylimidazolyl dimer, 2-(o-nitrophenyl)-4,5-diphenylimidazolyl dimer, 2-(p-phenyl)-4,5-diphenylimidazolyl dimer, 2-(o-bromophenyl)-4,5-diphenylimidazolyl dimer, 2-(1'-naphthyl)-4,5-diphenylimidazolyl dimer, 2-(2'-chloro-1'-naphthyl)-4,5-diphenylimidazolyl dimer, etc. In these examples, the lophine structures are the same. The dimers wherein the lophine structures are different are also usable; examples thereof are 2-phenyl, 2'-(o-chlorophenyl)-4,4',5,5'-tetraphenyl biimidazole, 2-(o-chlorophenyl)-2'-phenyl, 4,5-(di-m-anisyl)-4',5'-diphenyl biimidazole, etc.

The amount of the dimer to be incorporated into the composition of the invention may be usually from 1 to 50% by weight, preferably from 1 to 20% by weight. It is particularly favorable that the equivalent proportion of the dimer to the organic carboxylic acid is between 0.1 and 2.0.

Further, the composition of the invention may include any photosensitizer for enhancing its sensitivity to light. The term "photosensitizer" is intended to mean any substance which is excited by irradiation with light and comes into collision with any other molecule to impart energy thereto, whereby a chemical reaction is initiated. Specific examples are as follows: aromatic ketone compounds (e.g. 4,4'-bisdimethylaminobenzophenone, thioxanthone, fluorenone, trinitrofluorenone), aromatic thioketone compounds (e.g. 4,4'-bis-dimethylaminothiobenzophenone), quinone compounds (e.g. benzoquinone, dichlorobenzoquinone, tetrachlorobenzoquinone, dichloronaphthoquinone, phenanthrenequinone, dichloroanthraquinone, dinitroanthraquinone, alizarin, benzanthraquinone), aromatic nitro compounds (e.g. dinitrofluorene, tetrafluorene, trinitrofluorene, nitroacenaphthene, 2,4,6-trinitroaniline), triarylpyrazoline compounds (e.g. triphenylpyrazoline), monoimidazole compounds (e.g. tetraphenylimidazole, triphenylimidazole), xanthene compounds (e.g. fluorescein, eosine Y, rose bengal, erythrosine B, phloxine), acridine compounds (e.g. acriflavine, riboflavine), coumarin compounds (e.g. 7-N-dimethylaminocoumarin), triphenylmethane compounds (e.g. thymol blue, bromothymol blue, bromocresol green), etc. Among them, aromatic ketone compounds, quinone compounds, aromatic nitro compounds, triarylpyrazole compounds and coumarin compounds are particularly preferred.

The photosensitizer can be added to in the composition by any conventional mixing procedure. For instance, the basic polymeric compound and the organic carboxylic acid are, if necessary, admixed with the triaryl imidazolyl dimer and/or the photosensitizer, and the resulting mixture is dissolved in an appropriate solvent to make a uniform solution wherein an acid and base pair is formed. Examples of the solvent are alcohols (e.g. methanol, ethanol, isopropanol, methyl cellosolve, ethyl cellosolve), ketones (e.g. acetone, methyl ethyl ketone), aromatic hydrocarbons (e.g. toluene, xylene), etc. These may be used alone or in combination. When the basic polymeric compound is in the form of liquid at room temperature or has a relatively low melting, softening or flowing point, it may be simply combined with the organic carboxylic acid and, optimally with other components, without using any solvent.

The resultant composition of the invention may be molded in an appropriate shape such as film, membrane or sheet by any molding procedure such as spreading, heat pressing, injection molding or melt extrusion. Further, the shaped product may be bonded onto any supporting material, if necessary, by the aid of a bonding agent. As the supporting material, there may be used steel, aluminum, plastics, glass, etc.

As the light source for the composition of the invention, there may be used any one which can irradiate a light abundant in rays having a wavelength of not more than 400 m$\mu$. Specific examples are mercury lamp, carbon arc lamp, xenone lamp, an ultraviolet ray fluorescent lamp, etc. Irradiation with light is usually carried out onto the shaped article of the composition of the invention through a positive or negative film having a desired image or pattern comprising a light transmitting portion and a light blocking portion. Alternatively, a light beam from the said light source may be applied onto the shaped article of the composition so as to trace a desired image or pattern.

As the result of irradiation with light, a latent image is formed on the surface of the shaped article of the composition. The irradiated part corresponding to the latent image has reduced hydrophilic properties in comparison with the non-irradiated part. This means that the polarity of the irradiated part is lower than that of the nonirradiated part.

The shaped article having the said latent image as the result of exposure to light may be utilized as such or after post treatment such as development. Where development is needed, an appropriate solvent may be chosen taking into consideration the difference in polarity between the irradiated portion and the non-irradiated portion of the article. In general, the use of water is preferred. Thus, water or any aqueous solution having a pH of 5.5 to 7.5 may be used for development of the composition of the invention after exposure to light.

One of the advantageous applications of the invention is the use of the composition in a shape having a small cross-section (e.g. film, membrane, sheet), sometimes bonded on a supporting material. Thus, the shaped product of the composition of the invention is usually irradiated with light to make surface differences in hydrophilic properties or polarity between an irradiated part and a nonirradiated part and then utilizing the product as such or after etching or washing with water. In the former case (i.e. utilization of the irradiated product as such), it may be used as the material for electronic photography, electrostatic printing, image recording, etc. In the latter case (i.e. utilization of the irradiated product after development), it may be used as the material for a negative resist, an offset printing plate, a relief printing plate, etc.

When desired, any coloring material such as dyestuff or pigment may be incorporated into the composition. The resultant composition is utilizable for masking.

Practical and presently preferred embodiments of the invention are illustratively shown in the following examples wherein % and part(s) are by weight unless otherwise indicated.

EXAMPLES 1–8

The polyester (1 part) prepared by direct polymerization of 2-methyl-2-(N,N-dimethylamino)methyl-1,3-propanediol and terephthalic acid and a designated amount of an organic carboxylic acid as shown in Table 1 were dissolved in methyl ethyl ketone. The solution was applied uniformly onto the surface of an aluminum plate of 200$\mu$ in thickness as previously subjected to anodic oxidation to make a film of about 2$\mu$, and the film was dried with hot air at 50° C. for 5 minutes. The thus prepared photosensitive plate was closely contacted with a negative film and exposed to irradiation with a high pressure mercury lamp ("Polymer printer 3000" manufactured by Orc. K.K.) for a period of time as shown in Table 1. The resultant plate was immersed in water of pH 7 at 20° C. and washed with water for development. The resulting plate was coated with rubber and dried in the air at room temperature.

The thus obtained printing plate had a sharp image of high resolving power and good half tone. The printing plate was set on an offset printing machine ("Ryobi KR 480" manufactured by Ryobi K.K.), and continuous printing was effected to obtain printed materials having an image as clearly reproduced.

TABLE 1

| Example | Organic carboxylic acid | Amount added (part(s)) | Exposure time (minute(s)) |
|---|---|---|---|
| 1 | N—(4-Nitrophenyl)-glycine | 0.5 | 2 |
| 2 | N—Methylindoxylic acid | 0.5 | 5 |
| 3 | 4-Chlorobenzoylformic acid | 0.6 | 5 |
| 4 | 4-Nitrophenoxyacetic acid | 0.5 | 2 |
| 5 | S—Hydroxyethylthio-phenoxyacetic acid | 0.5 | 5 |
| 6 | Indol-3-acetic acid | 0.4 | 5 |
| 7 | 4-Nitrophenylacetic acid | 0.6 | 7 |
| 8 | 4-Nitrohomophthalic acid | 0.4 | 10 |

EXAMPLE 9

The polymeric compound (1 part) prepared by polymerization of 2-(N,N-diethylamino)ethyl methacrylate and ethylene in a weight proportion of 30:70, 2-(o-chlorophenyl)-4,5-(m-dianisyl)imidazolyl dimer (0.1 part) and 3-chlorophenylglycine (0.3 part) were dissolved in a mixture of methyl ethyl ketone and toluene in a volume proportion of 5.5:4.5. The solution was applied uniformly onto a polypropylene film (thickness, 60$\mu$; "Toyobo Pylene Film P1120 No. 60" manufactured by Toyo Kasei Kogyo K.K.) by the use of a wire bar and dried at 70° C. for 5 minutes to give a photosensitive film having a photosensitive layer of 5$\mu$ thick. Onto the surface of the film, a negative film was closely contacted and exposed to irradiation with chemical lamps (20 W×10 lamps; distance between lamp and photosensitive film, 45 mm) for 1.5 minutes. The film after exposure was immersed in a developing solution of bromophenol blue (0.005 part) in a mixture of water and methanol in a volume proportion of 4:6 (10 parts) for 30 seconds to give a positive image of dark blue color. The dot resolving power was 150 lines/inch.

EXAMPLES 10–18

In the same manner as in Example 9 but using a photosensitive compound as shown in Table 2 in place of 2-(o-chlorophenyl)-4,5-(m-dianisyl)imidazolyl dimer, there was prepared a photosensitive film, which was exposed for a period of time as shown in Table 2 to obtain a positive image of dark blue color having a dot resolving power of not less than 150 lines/inch.

TABLE 2

| Photosensitive | Amount added | Exposure time |
|---|---|---|
| compound | (part(s)) | (minute(s)) |
| Example | | |
| 10 | Fluorenone | 0.1 | 3.5 |
| 11 | Thioxanthone | 0.1 | 3.5 |
| 12 | 2-Methylanthraquinone | 0.1 | 3.5 |
| 13 | Tetrachloro-1,4-benzoquinone | 0.05 | 3.5 |
| 14 | 2,3-Dichloro-1,4-naphthoquinone | 0.05 | 3.5 |
| 15 | Dibenzosuberone | 0.1 | 3.5 |
| 16 | 6,11-Dihydrodibenzo-(b,e)thiepin-11-one | 0.1 | 3.5 |
| 17 | Benzophenone | 0.2 | 4 |
| 18 | — | 0 | 5 |

EXAMPLE 19

The polyester (1 part) prepared by direct polymerization of 2-methyl-2-(N,N-dimethylamino)methyl-1,3-propanediol and terephthalic acid, N-phenylglycine (0.4 part) and 2-(o-chlorophenyl)-4,5-diphenylimidazolyl dimer (0.15 part) were dissolved in methyl ethyl ketone (8 parts). The solution was applied uniformly onto a paper sheet as previously treated with an electroconductive agent ("Dow ECR34" manufactured by Dow Chemical Co.) and dried with a hot air dryer at 70° C. for 5 minutes to make a photosensitive layer of 6μ thick. The thus prepared photosensitive sheet was closely contacted with a negative film and exposed to irradiation with chemical lamps (20 W×10 lamps; distance between lamp and photosensitive sheet, 45 mm) for 2.5 minutes. The exposed sheet was passed through an electronic copying machine ("Copistar 211" manufactured by Mita Kogyo K.K.), whereby a tonner was attached onto the exposed parts to give a positive image. The dot resolving power was 150 lines/inch.

EXAMPLES 20–29

In the same manner as in Example 19 but using designed amounts of an organic carboxylic acid and a photosensitizer as shown in Table 3 in place of N-phenylylycine, there was prepared a photosensitive sheet having a photosensitive layer of 3μ thick. The thus prepared photosensitive sheet was closely contacted with a negative film and exposed to irradiation with chemical lamps for a period of time as shown in Table 3. The exposed sheet was passed through an electronic copying machine to give a positive image. The dot resolving power was as shown in Table 3.

TABLE 3

| | | | | | Dot resolving power (lines/inch) | | |
|---|---|---|---|---|---|---|---|
| Example | Organic carboxylic acid | Amount used (part(s)) | Photosensitizer | Amount used (part(s)) | Exposed for 1.5 minutes | Exposed for 3 minutes | Exposed for 4.5 minutes |
| 20 | N—(4-Nitrophenyl)-glycine | 0.3 | — | 0 | 175 | 200 | 200 |
| 21 | N—(4-Nitrophenyl)-glycine | 0.3 | Triphenylpyrazoline | 0.05 | 200 | 200 | 200 |
| 22 | 4-Nitrothiophenoxyacetic acid | 0.3 | — | 0 | 133 | 133 | 133 |
| 23 | 4-Nitrothiophenoxyacetic acid | 0.3 | 7-N,N'—Dimethylaminocoumarin | 0.05 | 150 | 150 | 150 |
| 24 | 4-Chlorobenzoylformic acid | 0.6 | — | 0 | 133 | 133 | 133 |
| 25 | N—Phenylalanine | 0.6 | 2-Nitrofluorene | 0.05 | 150 | 150 | 150 |
| 26 | N—Phenylglutamine | 0.5 | — | 0 | 133 | 133 | 150 |
| 27 | Phenylcarboxymethyl selenide | 0.4 | — | 0 | 133 | 150 | 150 |
| 28 | (2-Nitrophenoxy)-acetic acid | 0.5 | Michler's ketone | 0.03 | 133 | 133 | 133 |
| 29 | Indoxylic acid | 0.5 | 2,3,4,5-Tetraphenylimidazole | 0.03 | 150 | 200 | 200 |

EXAMPLE 30

The polyamide (100 parts) prepared by polymerization of N-(β-aminoethyl)piperazine, adipic acid and ε-caprolactam in a weight proportion of 40:50:38, 4-nitrophenylglycine (50 parts), 2-(2'-chloro-1'-naphthyl)-4,5-(m-dianisylimidazole) dimer (20 parts) and 7-N-dimethylaminocoumarin (3 parts) were dissolved in methanol, and the solution was spread to make a sheet of about 1 mm thick. The sheet was bonded on the surface of an iron plate of 28 mm thick by the aid of a bonding agent to make a photosensitive plate. Onto the photosensitive plate, a negative film with a dot resolution of 150 lines/inch was closely contacted, and chemical lamps or 200 w/cm² were irradiated thereon for a period of 1.5 minutes. Then, the exposed plate was brushed in tap water of pH 7.5 for 1 minute and dried with hot air at 60° C. for 10 minutes.

The thus prepared relief plate had an image exactly and sharply corresponding to that in the negative film, and the shoulder angle at the relief section was about 70°. Using the relief plate, printing was effected with an automatic relief printing press to give printed materials having a well reproduced image.

The image of the relief plate was covered by a cellophane tape leaving a portion uncovered and washed by spraying with water of pH 4.0 for 0.5 minute. Then, the cellophane tape was removed and the plate dried. The printing test as above was again carried out using the resulting plate. As the result, there were obtained printed materials wherein the dot image at the portion left uncovered was very clear in comparison with that at the other portions.

EXAMPLE 31

Poly(4-vinylpyridine) (manufactured by Koei Chemical K.K.) (50 parts), 4-nitrothiophenoxyacetic acid (7 parts), 2-(o-nitrophenyl)-4,5-diphenylimidazole dimer (10 parts) and fluorescein (3 parts) were dissolved in a mixture of acetone and methanol, and the solution was applied on a paper sheet of 0.3 mm thick by the use of a bar coater, followed by drying in the air to give a photosensitive sheet. Onto the photosensitive sheet, a negative film as used in Example 30 was closely contacted, and chemical lamps of 200 W/cm² were irradiated thereon for a period of 1.5 minutes. The exposed sheet was set on an offset printing machine, and printing was carried out to give printed materials having a well reproduced image.

EXAMPLE 32

The polymeric compound (1 part) prepared by polymerization of N,N'-dimethylaminoethyl methacrylate (56 parts) and methyl methacrylate (44 parts) in a weight proportion of 56:44, 2-(o-chlorophenyl)-4,5-(m-dianisyl)imidazole dimer (0.24 part), 4-nitrophenylglycine (0.4 part) and triphenylpyrazoline (0.05 part), carbon black (0.15 part) and tetrahydrofuran (10 parts) were mixed together, and the mixture was applied onto a biaxially stretched film of polyethylene terephthalate of 100μ thick and dried to give a photosensitive sheet of 3μ thick. The active light absorption rate at a wavelength of 300 to 400 μm measured by the use of a spectrophotometer was 99.9% or more.

Onto the photosensitive sheet, a negative film was closely contacted, and irradiation with a ultra high pressure mercury lamp of 3 KW was effected at a distance of 50 cm for 2 minutes. Then, tap water having a pressure of 3 kg/cm² was sprayed onto the exposed sheet for about 0.5 minute and dried to give a sharp image within a range of 2 to 90% in dot concentration.

The thus obtained positive film having an image was closely contacted onto the photosensitive sheet before exposure and treated in the same manner as above, whereby a negative film having a reverse image with good reproduction of dots was obtained. This negative film was closely contacted onto a sheet of "Toyobo PRINTIGHT RF-95" and exposed for 4.5 minutes, followed by washing with water for 2.5 minutes to give a relief printing plate having a sharp image.

EXAMPLE 33

In the same manner as in Example 32 but using S-n-butylthioacetic acid (0.3 part) in place of 4-nitrophenylglycine, the operations were carried out, and substantially the same results as above were obtained.

What is claimed is:

1. A photosensitive resin composition which comprises (1) at least one of the group comprising basic polymeric compounds which have a molecular weight of not less than 1,000, contain basic nitrogen atoms and are themselves poor in hydrophilic properties but, which in the presence of an acidic substance, show good hydrophilic properties due to the acid-based interaction, and (2) at least one of the group comprising organic carboxylic acids which are themselves acidic but, when irradiated with light, lose their acidic property due to a chemical conversion.

2. The composition according to claim 1, which further comprises a photosensitizer.

3. The composition according to claim 1, wherein the basic polymeric compound has a pKa value (the negative logarithm of acidity constant) of 2 to 15 when determined in an aqueous medium by potentiometric titration.

4. The composition according to claim 1, wherein the basic polymeric compound comprises monomeric units having basic nitrogen atoms and has a nitrogen content of 0.1 to 25 equivalents per kg.

5. The composition according to claim 1, wherein the organic carboxylic acid has a hetero atom or a conjugated carbon atom on the carbon atom to which a carboxyl group is bonded.

6. The composition according to claim 1, wherein the organic carboxylic acid is the one chosen from 2-nitrophenylacetic acid, 4-nitrophenylacetic acid, 4-nitrohomophthalic acid, 2,4-dinitrophenylacetic acid and 4,4'-dinitrodiphenylacetic acid.

7. The composition according to claim 1, wherein the organic carboxylic acid is selected from compounds of the formula:

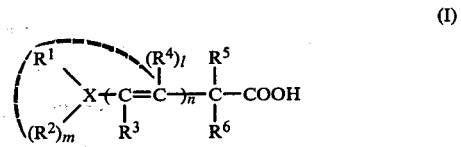

wherein X is nitrogen, oxygen, sulfur or selenium, $R^1$ and $R^2$ and each hydrogen, substituted or unsubstituted aryl, substituted or unsubstituted $C_1$-$C_6$ or phenylene, $R^3$ and $R^4$ are each hydrogen or $C_1$-$C_3$ alkyl, $R^5$ and $R^6$ are each hydrogen or substituted or unsubstituted $C_1$-$C_6$ alkyl and l, m and n are each an integer of 0 or 1; compounds of the formula;

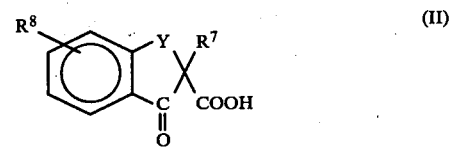

wherein Y is —$NR^9$— or sulfur, $R^7$ and $R^9$ are each hydrogen or $C_1$-$C_3$ alkyl and $R^8$ is hydrogen, nitro, cyano, lower alkoxy or halogen; and compounds of the formula:

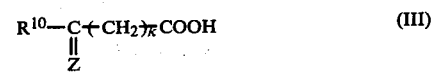

wherein Z is oxygen or sulfur, $R^{10}$ is substituted or unsubstituted phenyl and k is an integer of 0 or 1.

8. The composition according to claim 2, wherein the photosensitizer is selected from aromatic ketone compounds, aromatic thioketone compounds, quinone compounds, aromatic nitro compounds, triarylpyrazoline compounds, monoimidazole compounds, xanthene compounds, acridine compounds, coumarin compounds and triphenylmethane compounds.

9. The composition according to claim 1, which further comprises a triarylimidazolyl dimer.

10. The composition according to claim 9, which further comprises a photosensitizer.

11. A photosensitive resin composition which comprises (1) a polyester formed from 2-methyl-2-(N,N-dimethylaminomethyl)-1,3 propanediol and terephthalic acid, which polyester has a molecular weight of not less than 1,000 and has poor hydrophilic properties, but which in the presence of an acidic substance has good hydrophilic properties and (2) 4-nitrophenylacetic acid, said composition being adapted to display variance in hydrophilic properties upon irradiation with light.

* * * * *

UNITED STATES PATENT AND TRADEMARK OFFICE
CERTIFICATE OF CORRECTION

PATENT NO. : 4,405,705
DATED : September 20, 1983
INVENTOR(S) : Kuniomi Etoh et al.

It is certified that error appears in the above—identified patent and that said Letters Patent is hereby corrected as shown below:

Column 12, Claim 7, line 23, "and" should read --are--.

Column 12, Claim 7, line 24, after "$C_1$-$C_6$" insert --alkyl--.

Signed and Sealed this

Twenty-ninth Day of November 1983

[SEAL]

Attest:

GERALD J. MOSSINGHOFF

Attesting Officer   Commissioner of Patents and Trademarks